United States Patent
Yeh

(10) Patent No.: US 10,617,015 B2
(45) Date of Patent: Apr. 7, 2020

(54) STACKING AND MOVING APPARATUS FOR MANUFACTURING PRINTED CIRCUIT BOARDS

(71) Applicant: Shih-Hao Ray Yeh, Delta (CA)

(72) Inventor: Shih-Hao Ray Yeh, Delta (CA)

( * ) Notice: Subject to any disclaimer, the term of this patent is extended or adjusted under 35 U.S.C. 154(b) by 0 days.

(21) Appl. No.: 16/147,391

(22) Filed: Sep. 28, 2018

(65) Prior Publication Data

US 2019/0306992 A1 Oct. 3, 2019

(30) Foreign Application Priority Data

Mar. 28, 2018 (TW) ............................. 107204031 U

(51) Int. Cl.
 *H05K 3/46* (2006.01)
 *H05K 13/08* (2006.01)
 *H05K 13/00* (2006.01)

(52) U.S. Cl.
 CPC ....... *H05K 3/4679* (2013.01); *H05K 13/0015* (2013.01); *H05K 13/0069* (2013.01); *H05K 13/0812* (2018.08)

(58) Field of Classification Search
 USPC ....................................................... 361/748
 See application file for complete search history.

(56) References Cited

U.S. PATENT DOCUMENTS

2010/0311494 A1* 12/2010 Miller ....................... A63F 1/18
 463/22
2013/0217107 A1* 8/2013 Pederson ................. C12Q 1/22
 435/287.4

* cited by examiner

*Primary Examiner* — Andargie M Aychillhum
(74) *Attorney, Agent, or Firm* — Bever, Hoffman & Harms, LLP

(57) ABSTRACT

An apparatus for manufacturing a printed circuit board having a substrate with an upper and a lower surfaces is disclosed. The apparatus is configured to implement a stacking operation disposing a first insulating material and a second insulating material on the upper and the lower surfaces of the substrate respectively. The apparatus includes a stacking operation table with a first and a second sides, a first measuring table and a first transporting device. The first measuring table is disposed adjacent to the first side of the stacking operation table, and has a first and a second image sensing elements disposed at a pair of diagonal corners. The first transporting device is movably disposed on a location higher than the stacking operation table and the first measuring table to transport the first and the second insulating materials to the first measuring table and then to the stacking operation table sequentially.

20 Claims, 4 Drawing Sheets

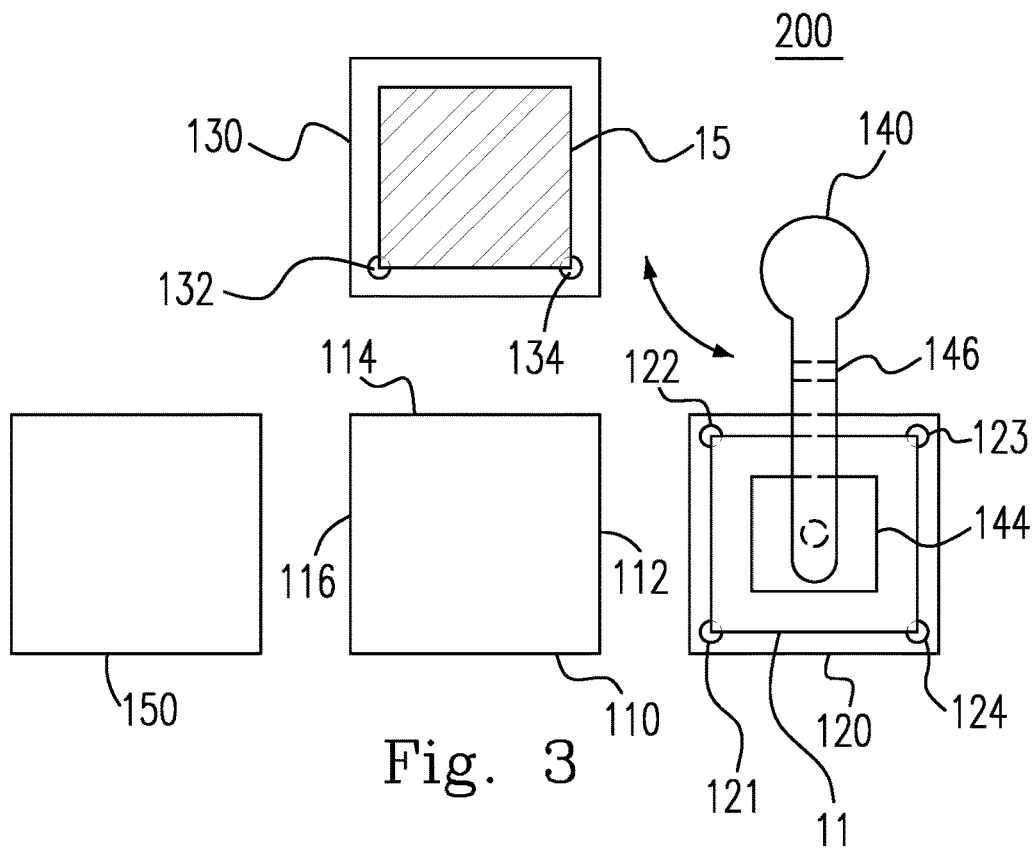
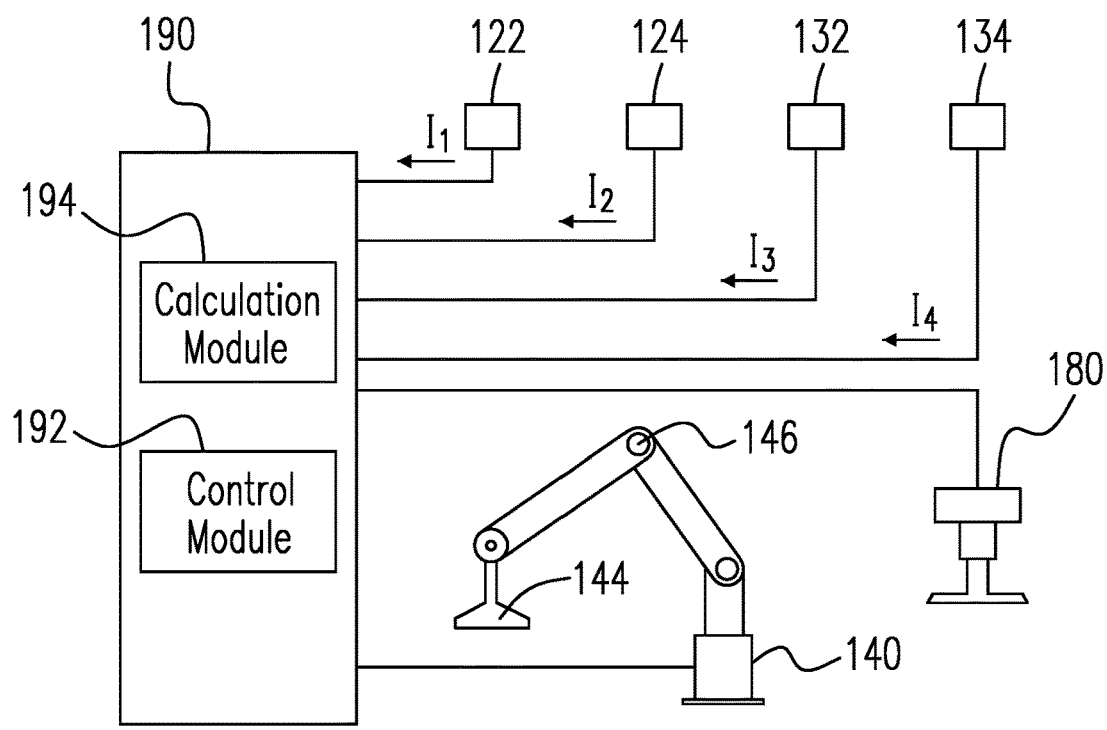
Fig. 3
Fig. 4

STACKING AND MOVING APPARATUS FOR MANUFACTURING PRINTED CIRCUIT BOARDS

CROSS-REFERENCE TO RELATED APPLICATION AND CLAIM OF PRIORITY

The application claims the benefit of Taiwan Patent Application No. 107204031, filed on Mar. 28, 2018, at the Taiwan Intellectual Property Office, the disclosures of which are incorporated herein in their entirety by reference.

FIELD OF THE INVENTION

The present invention is related to a stacking and moving apparatus, and more particularly to a stacking and moving apparatus for manufacturing printed circuit boards.

BACKGROUND OF THE INVENTION

The manufacturing process for fabricating printed circuit boards (PCB) includes steps of multi-layer stacking to stack conducting layers and insulating layers on each other and then pressing to integrate the layers. A common PCB manufacturing procedure is to start from a core substrate, subsequently attach metal conducting layers on both sides of the core substrates by means of stacking, perform pressing and etching on the metal conducting layers to form circuits, stack to attach insulating material on both sides of the core substrate with two circuit layers, and then repeal the aforementioned steps until the outer circuit layer is formed.

After years of technical innovation and improvement, the regular substrates and insulating materials have a form of sheets having a rectangular shape with longitudinal and transverse dimensions of about 20 to 30 inches while the thickness can be only a few millimeters or even less than one millimeter. The sizes of the substrates and insulating materials are about the same. According to traditional stacking methods, the operators need to manually transport and place each sheet of the materials at appropriate locations based on visual inspections and personal experience, which significantly limits the production efficiency and causes deviations in terms of quality. The manual operation for transportation and stacking can no longer satisfy the needs of the industry due to the large amount of market requirements and the rapidly reduced lead time.

Some PCB manufacturers tend to use a method of disposing markers at some specific locations on the materials and taking advantage of visual identification by a computer to establish models of automatic transportation and stacking for production. However, these methods rely on the accuracy of the locations of the markers previously disposed on the surface of the materials, which increase the production cost of the materials on the one hand. On the other hand, errors may occur if any inconsistency or deviation of locations among the markers exists on different batches of the materials made by the vendors. Therefore, there are technical issues to be resolved to avoid the abovementioned problems.

SUMMARY OF THE INVENTION

Thus, there is a need to develop a novel transportation as well as a stacking apparatus for PCB manufacturing, which can automatically identify the outer contour of each of the substrate or insulating materials and place the substrate or insulating material at the correct location.

In accordance with one aspect of the present invention, an apparatus for manufacturing a printed circuit board having a substrate with an upper and a lower surfaces is disclosed. The apparatus is configured to implement a stacking operation disposing a first insulating material and a second insulating material on the upper and the lower surfaces of the substrate respectively. The apparatus includes a stacking operation table with a first and a second sides, a first measuring table and a first transporting device. The first measuring table is disposed adjacent to the first side of the stacking operation table, and has a first and a second image sensing elements disposed at a pair of diagonal corners. The first transporting device is movably disposed on a location higher than the stacking operation table and the first measuring table to transport the first and the second insulating materials to the first measuring table and then to the stacking operation table sequentially. When one of the first and the second insulating materials is transported to the first measuring table, the first and the second image sensing elements perform an image collection for the one insulating material on the first measuring table simultaneously to obtain a first and a second image data respectively. During the period that the one insulating material is transported from the first measuring table to the stacking operation table, the first transporting device determines a specific insulating material placing location where the one insulating material is to be disposed on the stacking operation table based on the first and the second image data.

In accordance with other aspect of the present invention, a moving apparatus for implementing a stacking operation of an insulating material and a substrate is disclosed. The moving apparatus includes a stacking operation table having a first and a second sides, a first measuring table, a first transporting device and a processor. The first measuring table is disposed adjacent to the first side of the stacking operation table, and has a first and a second image sensing elements disposed at a first pair of diagonal corners of the first measuring table. The first transporting device is movably disposed on a location higher than the stacking operation table and the first measuring table to transport the insulating material to the first measuring table and then to the stacking operation table. The processor is electrically connected to the first and the second image sensing elements and the first transporting device. Under control of the processor: the first and the second image sensing elements perform image collection for the insulating material on the first measuring table to obtain a first and a second image data respectively, and the first and the second data are transmitted to the processor; during the period when the insulating material is transported from the first measuring table to the stacking operation table, the processor determines a virtual profile of the insulating material and a center position of the virtual profile based on the first and the second image data, and determines an insulating material placing location on the stacking operation table based on the virtual profile and the center position; and the first transporting device places the insulating material on the stacking operation table according to the insulating material placing location.

In accordance with one another aspect of the present invention, a stacking apparatus having a stacking operation table for stacking a plurality of thin materials basically of a rectangular shape is disclosed. The stacking apparatus includes an image sensing device, a transporting device and a processor. The image sensing device is configured to obtain a respective pair of images from a pair of diagonal locations at each of the plurality of thin materials. The transporting device is configured to transport each of the plurality of thin materials from a storage location to the stacking operation table. The processor is electrically connected to the image sensing device and the transporting device, and includes a calculation module determining a specific location parameter of each of the plurality of thin materials on the stacking operation table based on the respective pair of images; and a control module instructing the transporting device to place each of the plurality of thin materials on the stacking operation table in response to the specific location parameter of each of the plurality of thin materials.

The aforementioned apparatus and methods are applicable for automatic manufacturing. Thus, the present invention has utility for industry.

The objectives and advantages of the present invention will become more readily apparent to those ordinarily skilled in the art after reviewing the following detailed descriptions and accompanying drawings, in which:

BRIEF DESCRIPTION OF THE DRAWINGS

FIG. 3 is a schematic diagram showing a stacking and moving apparatus for manufacturing PCBs according to another embodiment of the present invention;

FIG. 4 is a schematic diagram showing a stacking and moving apparatus for manufacturing PCBs according to yet another embodiment of the present invention;

DETAILED DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; they are not intended to be exhaustive or to be limited to the precise form disclosed.

Figure 1:
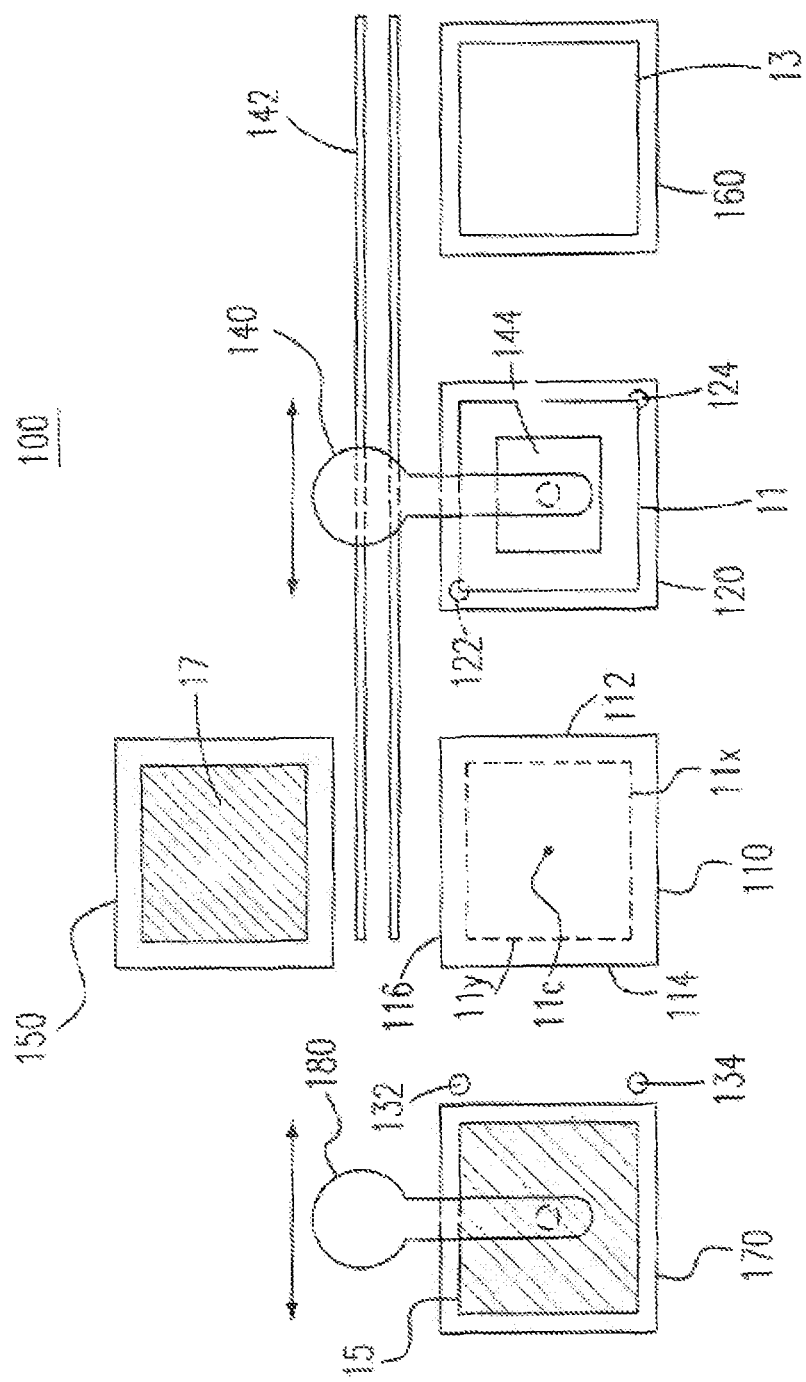
FIG. 1 is a schematic diagram showing a top view of the stacking and moving apparatus for manufacturing PCBs according to one embodiment of the present invention.

Please refer to FIG. 1, which shows a top view of the stacking and moving apparatus for manufacturing printed circuit boards (PCBs) according to one embodiment of the present invention. The stacking and moving apparatus 100 for manufacturing PCBs implements a stacking operation which disposes the first insulating material 11 and the second insulating material 13 on the upper and lower surfaces of the substrate material 15 respectively, by means of an automation process. The industry often uses the so-called prepreg material, which is formed of non-woven fiberglass fabric immersed in epoxy resin, as the insulating material in the layers of PCBs. However, the present invention also applies to the use of other types of insulating material. The outer shape of the first insulating material 11, the second insulating material 13 and the substrate material 15 are in general rectangular, and the size of each is close to that of the others. Thus, a multi-layer board structure can be formed by stacking those materials with precise alignments.

The mentioned substrate material 15 (or Core, according to the nomenclature in the PCB industry) at the initial production stage usually is formed of an insulating substrate in the middle with two copper sheets attached on the two main surfaces of the insulating substrate, such as a composite plate with a sandwich structure. The surfaces with copper sheets will then be processed by etching or cutting to form predetermined circuits thereon. Afterward, sheet-like insulating materials or conducting materials are attached on the two main surfaces consequently, and a multi-layered punted circuit board is formed. The present invention applies to the process of disposing insulating materials on both sides of the Core with conducting layers at the outer surface of the two sides, and the process of disposing conducting materials on both sides of the Core with insulating layers at the outer surface of the two sides as well.

In one embodiment of the present invention, the stacking and moving apparatus 100 for manufacturing PCBs includes a stacking operation table 110 and a measuring table 120 for performing image collection to the first and the second insulating materials 11, 13, which are usually large (some twenty to thirty inches in length as well as in width) sheets of prepreg and soft as paper. For the purpose of transporting these insulating materials 11, 13 efficiently and accurately, the stacking and moving apparatus 100 for manufacturing PCBs further includes a first transporting device 140, which is an automated moving device such as a robot or the like and (referring to FIG. 1, wherein the first transporting device 140 is disposed on the rail 142 and is movable between the tables) movably disposed at a position higher than the tables 110, 120 to transport the first and the second insulating materials 11, 13 from the insulating material storage location 160 to the first measuring table 120 and then to the stacking operation table 110 sequentially. The first transporting device 140 has a sucker 144, which can attach the transporting device 140 to the insulating materials 11, 13 at multiple locations by means of a vacuum device for transporting soft materials with large dimensions.

Figure 2:
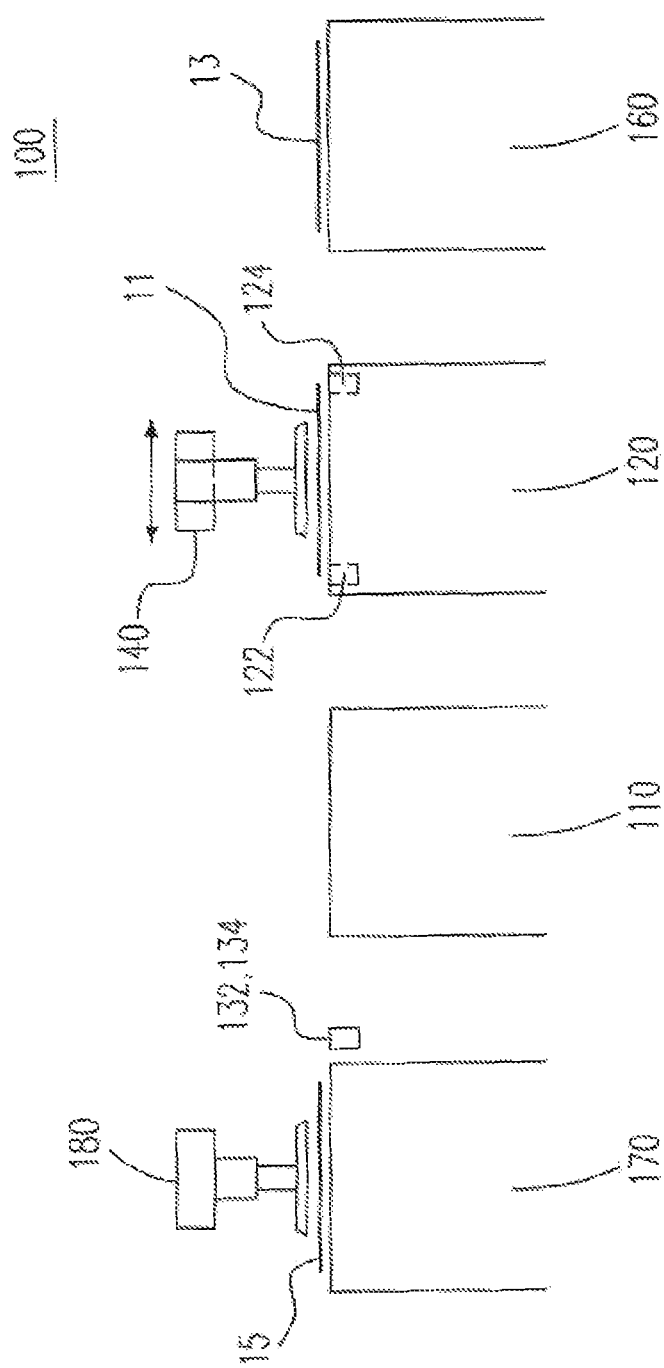
FIG. 2 is a schematic diagram showing a side view of the stacking and moving apparatus for manufacturing PCBs according to one embodiment of the present invention.

Please simultaneously refer to FIGS. 1 and 2. The stacking operation table 110 has a first side 112 and a second side 114. The first measuring table 120 is disposed adjacent to the first side of the stacking operation table 110, and is furnished with a first and a second image sensing elements 122, 124, such as image sensors, disposed at a pair of diagonal corners of the first measuring table 120. The illustration in FIG. 1 merely shows an example of the device layout according to the present invention. The first and the second image sensing elements 122, 124 can also be disposed on the other pair of diagonal corners, according to another embodiment of the present invention. When the first insulating material 11 or the second insulating material 13 is transported to the first measuring table 120, the first and the second image sensing elements 122, 124 can perform image collection for the insulating material 11 or 13 on the first measuring table 120 simultaneously to obtain a first and a second image data I1, I2 as shown in FIG. 4 respectively. Due to the softness of the material property, the insulating materials 11, 13 need to be fully laid down on the first measuring table 120, so as to allow the first and the second image sensing elements 122, 124 to collect images at the correct locations. It is appreciated that, from the illustration of FIG. 1, the first and second image data I1, I2 obtained by the first and the second image sensing elements 112, 124 respectively are related to the images at the corresponding corner areas of the first or the second insulating materials 11, 13.

Having the outer contour of a rectangular shape, the virtual profile of the first or the second insulating materials 11, 13, such as the lengths of the four sides and so on, can be determined by calculating for the directions and positions of two adjacent sides at each of the pairs of diagonal corners of the rectangular shape. Thus, the placing location for the first or the second insulating materials 11, 13 on the stacking operation table 110 can be determined based on the virtual profile of the first or the second insulating materials 11, 13. Taking the illustration in FIG. 1 as an example, the dotted lines show the determined placing location, including the bottom side 11x, the left side 11y and the center point 11c, for the first insulating material 11 on the stacking operation table 110.

According to the aforementioned embodiment, after the first and the second image data I1, I2 are transmitted from the first and the second image sensing elements 122, 124 to the first transporting device 140, during the period that one insulating material, the first insulating material 11 for example, is transported from the first measuring table 12 to the stacking operation table 110, the first transporting device 140 can determine where the insulating material is to be disposed on a specific insulating material placing location on the stacking operation table based on the first and the second image data I1, I2.

For the purpose of image collecting to the substrate material 15, the stacking and moving apparatus 100 for manufacturing PCBs according to the present invention also includes the third and the fourth image sensing elements 132, 134 disposed adjacent to the second side 114 of the stacking operation table 110 and toward the direction perpendicular to the surface of the stacking operation table 110. In one embodiment, the third and the fourth image sensing elements 132, 134 perform image collection for a second pair of diagonal corners (not shown) of the substrate material 15 to obtain a third and a fourth image data respectively. The stacking and moving apparatus 100 for manufacturing PCBs according to the present invention further includes a second transportation device 180, for example an automated moving device such as a robot or the like, to transport the substrate material 15 from the substrate material storage location 170 to the stacking operation table 110 while passing over the third and the fourth image sensing elements 132, 134. According to one embodiment of the present invention, the second transportation device 180 can also have a sucker (not shown) which can attach the transporting device 180 to the substrate material 15 by means of a vacuum device.

Notably, the substrate material 15 includes metal conductive layers which possess certain rigidity, and thus the outer shape thereof will not deform during the transportation process. The third and the fourth image sensing elements 132, 134 can perform image collection for the second pair of diagonal corners of the substrate material 15 to obtain the third and the fourth image data I3, I4 illustrated in FIG. 4 at a different time when the substrate material 15 is transported over the third and the fourth image sensing elements 132, 134, without the need to let the substrate material 15 to be displaced on a measuring table. This can enhance operational efficiency.

Likewise, with an outer contour of a rectangular shape, the virtual profile of the substrate material 15 such as the lengths of the four sides and so on, can be determined by calculating for the directions and positions of two adjacent sides at each of the pairs of diagonal corners of the rectangular shape. Thus, the placing location for the substrate material 15 on the stacking operation table 110 can be determined based on the virtual profile of the substrate material 15. After the third and the fourth image data I3, I4 are transmitted from third and the fourth image sensing elements 132, 134 to the second transporting device 180, during the period that the substrate material 15 is transported to the stacking operation table 110, the second transporting device 180 can determine where the substrate material is to be disposed on a specific location on the stacking operation table based on the third and the fourth image data I3, I4.

Again, referring to FIG. 1, the stacking and moving apparatus 100 further includes a hot pressing table 150 disposed near the third side 116 of the stacking operation table 110 and different from the first and the second sides 112, 114. The hot pressing table 150 is configured to receive a stack 17 formed of the first and the second insulating materials 11, 13 and the substrate material 15. The above-mentioned operation process can be repeated until the end product of a printed circuit board is formed.

Please refer to FIG. 3, which is a schematic diagram showing a stacking and moving apparatus 200 for manufacturing PCBs according to another embodiment of the present invention. The stacking and moving apparatus 200 for manufacturing PCBs comprises a stacking operation table 110 having a first side 112 and a second side 114, a first measuring table 120 disposed adjacent to the first side 112 of the stacking operation table 120 and having a first sensing element 122 and a second image sensing element 124 disposed at a pair of diagonal corners of the first measuring table 120, a second measuring table 130 disposed adjacent to the second side 114 of the stacking operation table 110 and having a third image sensing element 132 and a fourth sensing element 134 disposed along the same side at the second measuring table 130 adjacent to the second side 114 of the stacking operation table 110 and a first transporting device 140. The first transporting device 140, such as a robot, is movably disposed on a location higher than the stacking operation table 110, the first measuring table 120, and the second measuring table 130 to transport the insulating material 11 to the first measuring table 120 and then to the stacking operation table 110. The first transporting device 140 has a joint 146 to allow the sucker 114 to be more flexibly handled. According to the layout as shown in FIG. 3, the first transporting device 140 can also configured to transport the substrate material 15 to the second measurement table 130 and then to the stacking operation table 110.

The first measuring table 120 in FIG. 3 further includes a fifth sensing element 121 and a sixth sensing element 123 disposed at the other pair of diagonal corners. In this embodiment, image collecting can be performed simultaneously at the four corners of the first insulating material 11 or the second insulating material 13 so as to obtain more sufficient data for use to more accurately estimate the profile of the first insulating material 11 or the second insulating material 13. Notably, the image sensing elements 121-124 and 132, 134 are charged coupled device (CCD) in general, which can transfer image data into electronic signals for the need of subsequent analysis.

Please refer to FIGS. 1-5A and 5B, the stacking and moving apparatus 100/200 according to the present invention can also include a processor 190 electrically connected to the first, the second, the third and the fourth image sensing elements 122, 124, 132, 134 and the first and the second transporting devices 140, 180. In one embodiment, the stacking operation table 110 can be used for stacking the sheet materials, such as the first and the second insulating materials 11, 13 and the substrate material 15 placed thereon.

The processor 190 includes a calculation module 192 and a control module 194. Under the control of the processor 190, the first and the second image sensing elements 122, 124 perform image collection for the insulating material 11 or 13 on the first measuring table 120 to obtain a first and a second image data I1, I2 respectively, and the first and the second data I1, I2 are transmitted to the processor 190. During the period when the insulating material 11 or 13 is transported from the first measuring table 120 to the stacking operation table 110, the calculation module 192 of the processor 190 determines a virtual profile of the insulating material 11 or 13 and a center position of the virtual profile based on the first and the second image data I1, I2, and determines an insulating material placing location on the stacking operation table 110 based on the virtual profile and the center position. Afterwards, the control module 194 instructs the first transporting device to place the insulating material 11 or 13 on the stacking operation table 110 according to the insulating material 11 or 13 placing location. Similarly, the substrate material 15 can be placed on the stacking operation table 110 under the control of the processor 190.

Figure 5A:
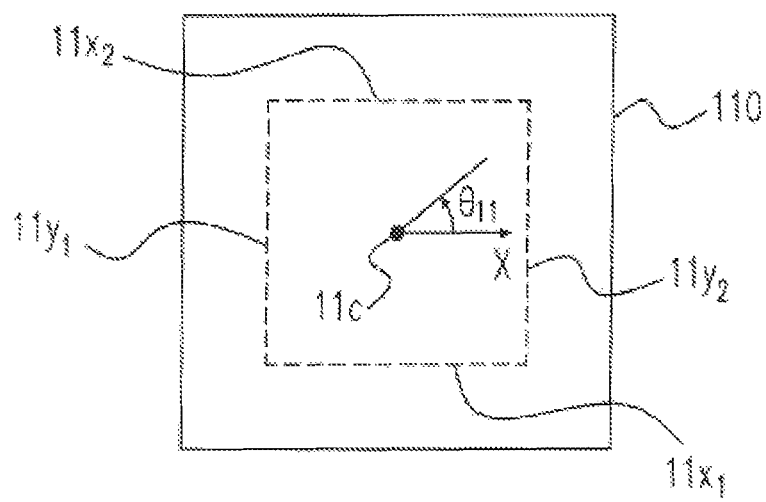
FIGS. 5A and 5B are schematic diagrams showing the locations for the first and the second insulating materials to be placed on the stacking operation table respectively.
Figure 5B:
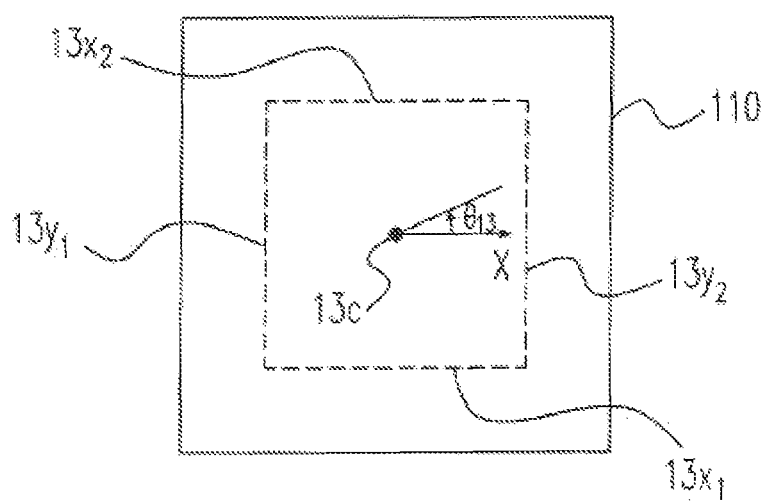

FIGS. 5A and 5B shows some parameters relevant to the locations for the first and the second insulating materials 11, 13 to be placed on the stacking operation table 110 respectively. Parameters relevant to the insulating material placing location include, but are not limited to, the orientation angle Θ11 to the transverse axis X of the stacking operation table 110, the center point 11c and the four sides 11x1, 11x2, 11y1, 11y2 of the first insulating material 11 and the orientation angle Θ13 to the transverse axis X of the stacking operation table 110, the center point 13c and the four sides 13x1, 13x2, 13y1, 13y2 of the second insulating material 13. The skilled person in the art can realize the parameters relevant to the location for the substrate material 15 to be placed on the stacking operation table 110 based on the same concept.

Embodiments

1. An apparatus for manufacturing a printed circuit board having a substrate with an upper and a lower surfaces, wherein the apparatus is configured to implement a stacking operation disposing a first insulating material and a second insulating material on the upper and the lower surfaces of the substrate respectively. The apparatus includes a stacking operation table with a first and a second sides, a first measuring table and a first transporting device. The first measuring table is disposed adjacent to the first side of the stacking operation table, and has a first and a second image sensing elements disposed at a pair of diagonal corners. The first transporting device is movably disposed on a location higher than the stacking operation table and the first measuring table to transport the first and the second insulating materials to the first measuring table and then to the stacking operation table sequentially. When one of the first and the second insulating materials is transported to the first measuring table, the first and the second image sensing elements perform an image collection for the one insulating material on the first measuring table simultaneously to obtain a first and a second image data respectively. During the period that the one insulating material is transported from the first measuring table to the stacking operation table, the first transporting device determines a specific insulating material placing location where the one insulating material is to be disposed on the stacking operation table based on the first and the second image data.
2. The apparatus in Embodiment 1, wherein any of the first and the second insulating materials and the substrate has a rectangular shape, and sizes thereof are about the same.
3. The apparatus in Embodiment 1, further comprising a second measuring table disposed adjacent to the second side of the stacking operation table, and having a third and a fourth image sensing elements disposed at two corners of a side of the second measuring table near the second side of the stacking operation table.
4. The apparatus in Embodiment 3, further comprising a second transporting device, configured to transport the substrate to the second measuring table and then to the stacking operation table.
5. The apparatus in Embodiment 4, wherein the third and the fourth image sensing elements perform image collection for the substrate to obtain a third and a fourth image data respectively during the period when the substrate is transported from the second measuring table to the stacking operation table.
6. The apparatus in Embodiment 5, wherein during the period when the substrate is transported from the second measuring table to the stacking operation table, the second transporting device determines where the substrate is to be placed on a specific location on the stacking operation table based on the third and the fourth image data.
7. The apparatus in Embodiment 1 further comprising a hot-printing table disposed near a third side of the stacking operation table for receiving a stack formed of the first and the second insulating materials and the substrate, wherein the third side is different from the first and the second sides.
8. The apparatus in Embodiment 1, wherein the first transporting device is a robot, and each of the first and the second insulating materials is an insulating prepreg material formed of a glass fiber nonwoven material and an epoxy resin.
9. A moving apparatus for implementing a stacking operation of an insulating material and a substrate comprising a stacking operation table having a first and a second sides, a first measuring table, a first transporting device and a processor. The first measuring table is disposed adjacent to the first side of the stacking operation table, and has a first and a second image sensing elements disposed at a first pair of diagonal corners of the first measuring table. The first transporting device is movably disposed on a location higher than the stacking operation table and the first measuring table to transport the insulating material to the first measuring table and then to the stacking operation table. The processor is electrically connected to the first and the second image sensing elements and the first transporting device. Under control of the processor: the first and the second image sensing elements perform image collection for the insulating material on the first measuring table to obtain a first and a second image data respectively, and the first and the second data are transmitted to the processor; during the period when the insulating material is transported from the first measuring table to the stacking operation table, the processor determines a virtual profile of the insulating material and a center position of the virtual profile based on the first and the second image data, and determines an insulating material placing location on the stacking operation table based on the virtual profile and the center position; and the first transporting device places the insulating material on the stacking operation table according to the insulating material placing location.
10. The moving apparatus in Embodiment 9, further comprising a third and a fourth image sensing elements disposed adjacent to the second side of the stacking operation table and being perpendicularly directed to the stacking operation table.
11. The moving apparatus in Embodiment 10, further comprising a second transporting device configured to transport the substrate over the third and the fourth image sensing elements and onto the stacking operation table.

12. The moving apparatus in Embodiment 11, wherein under the control of the processor, the third and the fourth image sensing elements perform image collection for a second pair of diagonal corners of the substrate to obtain a third and a fourth image data respectively, and the third and the fourth image data are transmitted to the processor.

13. The moving apparatus in Embodiment 12, wherein the processor determines a virtual profile of the substrate and a center position of the virtual profile based on the third and the fourth image data, and determines where the substrate is to be placed on a specific location on the stacking operation table based on the virtual profile and the center position during the period when the substrate is transported from the second measuring table to the stacking operation table.

14. The moving apparatus in Embodiment 13, further comprising a second transporting device configured to place the substrate on the specific substrate location on the stacking operation table under the control of the processor.

15. The moving apparatus in Embodiment 14, wherein the first and the second transporting devices are the same device.

16. A stacking apparatus having a stacking operation table for stacking a plurality of thin materials basically of a rectangular shape, comprising an image sensing device, a transporting device and a processor. The image sensing device is configured to obtain a respective pair of images from a pair of diagonal locations at each of the plurality of thin materials. The transporting device is configured to transport each of the plurality of thin materials from a storage location to the stacking operation table. The processor is electrically connected to the image sensing device and the transporting device, and includes a calculation module determining a specific location parameter of each of the plurality of thin materials on the stacking operation table based on the respective pair of images; and a control module instructing the transporting device to place each of the plurality of thin materials on the stacking operation table in response to the specific location parameter of each of the plurality of thin materials.

17. The apparatus in Embodiment 16, further comprising a measuring table disposed between the storage location and the stacking operation table, wherein the thin materials are insulating prepreg materials formed of a glass fiber nonwoven material and an epoxy resin, and the image sensing device includes a first and a second image sensing elements disposed on the measuring table.

18. The apparatus in Embodiment 17, wherein the first and the second image sensing elements perform image collection for the each of the plurality of thin materials on the measuring table to obtain the respective pair of images simultaneously when each of the plurality of thin materials is placed on the measuring table by the transporting device, and the respective pair of images are transmitted to the processor.

19. The apparatus in Embodiment 16, further comprising a measuring table disposed between the storage location and the stacking operation table, wherein the thin materials include a substrate having a metal conductive layer 20. The apparatus in Embodiment 19, wherein the image sensing device performs image collection for the substrate on the measuring table to obtain the respective pair of images, and the first and the second image data are transmitted to the processor.

While the invention has been described in terms of what is presently considered to be the most practical and preferred embodiments, it is to be understood that the invention need not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. An apparatus for manufacturing a printed circuit board having a substrate with an upper and a lower surfaces, wherein the apparatus is configured to implement a stacking operation disposing a first insulating material and a second insulating material on the upper and the lower surfaces of the substrate respectively, the apparatus comprising:
   a stacking operation table having a first and a second sides;
   a first measuring table disposed adjacent to the first side of the stacking operation table, and having a first and a second image sensing elements disposed at a pair of diagonal corners of the first measuring table; and
   a first transporting device, movably disposed on a location higher than the stacking operation table and the first measuring table to transport the first and the second insulating materials to the first measuring table and then to the stacking operation table sequentially, wherein:
   when one of the first and the second insulating materials is transported to the first measuring table, the first and the second image sensing elements perform an image collection for the one insulating material on the first measuring table simultaneously to obtain a first and a second image data respectively; and
   during the period that the one insulating material is transported from the first measuring table to the stacking operation table, the first transporting device determines a specific insulating material placing location where the one insulating material is to be disposed on the stacking operation table based on the first and the second image data.

2. The apparatus as claimed in claim 1, wherein any of the first and the second insulating materials and the substrate has a rectangular shape, and sizes thereof are about the same.

3. The apparatus as claimed in claim 1, further comprising a second measuring table disposed adjacent to the second side of the stacking operation table, and having a third and a fourth image sensing elements disposed at two corners of a side of the second measuring table near the second side of the stacking operation table.

4. The apparatus as claimed in claim 3, further comprising a second transporting device configured to transport the substrate to the second measuring table and then to the stacking operation table.

5. The apparatus as claimed in claim 4, wherein the third and the fourth image sensing elements perform image collection for the substrate to obtain a third and a fourth image data respectively during the period when the substrate is transported from the second measuring table to the stacking operation table.

6. The apparatus as claimed in claim 5, wherein during the period when the substrate is transported from the second measuring table to the stacking operation table, the second transporting device determines where the substrate is to be placed on a specific location on the stacking operation table based on the third and the fourth image data.

7. The apparatus as claimed in claim 1 further comprising:
   a hot-printing table disposed near a third side of the stacking operation table for receiving a stack formed of the first and the second insulating materials and the substrate, wherein the third side is different from the first and the second sides.

8. The apparatus as claimed in claim 1, wherein the first transporting device is a robot, and each of the first and the second insulating materials is an insulating prepreg material formed of a glass fiber nonwoven material and an epoxy resin.

9. A moving apparatus for implementing a stacking operation of an insulating material and a substrate, comprising:
- a stacking operation table having a first and a second sides;
- a first measuring table disposed adjacent to the first side of the stacking operation table, and having a first and a second image sensing elements disposed at a first pair of diagonal corners of the first measuring table;
- a first transporting device, movably disposed on a location higher than the stacking operation table and the first measuring table to transport the insulating material to the first measuring table and then to the stacking operation table; and
- a processor electrically connected to the first and the second image sensing elements and the first transporting device, wherein under a control of the processor:
  - the first and the second image sensing elements perform image collection for the insulating material on the first measuring table to obtain a first and a second image data respectively, and the first and the second data are transmitted to the processor;
  - during the period when the insulating material is transported from the first measuring table to the stacking operation table, the processor determines a virtual profile of the insulating material and a center position of the virtual profile based on the first and the second image data, and determines an insulating material placing location on the stacking operation table based on the virtual profile and the center position; and
  - the first transporting device places the insulating material on the stacking operation table according to the insulating material placing location.

10. The moving apparatus as claimed in claim 9, further comprising a third and a fourth image sensing elements disposed adjacent to the second side of the stacking operation table and being perpendicularly directed to the stacking operation table.

11. The moving apparatus as claimed in claim 10, further comprising a second transporting device configured to transport the substrate over the third and the fourth image sensing elements and onto the stacking operation table.

12. The moving apparatus as claimed in claim 11, wherein under the control of the processor, the third and the fourth image sensing elements perform image collection for a second pair of diagonal corners of the substrate to obtain a third and a fourth image data respectively, and the third and the fourth image data are transmitted to the processor.

13. The moving apparatus as claimed in claim 12, wherein the processor determines a virtual profile of the substrate and a center position of the virtual profile based on the third and the fourth image data, and determines where the substrate is to be placed on a specific location on the stacking operation table based on the virtual profile and the center position during the period when the substrate is transported from the second measuring table to the stacking operation table.

14. The moving apparatus as claimed in claim 13, further comprising a second transporting device configured to place the substrate on the specific substrate location on the stacking operation table under the control of the processor.

15. The moving apparatus as claimed in claim 14, wherein the first and the second transporting devices are the same device.

16. A stacking apparatus having a stacking operation table for stacking a plurality of thin materials basically of a rectangular shape, the apparatus comprising:
- an image sensing device configured to obtain a respective pair of images from a pair of diagonal locations at each of the plurality of thin materials;
- a transporting device configured to transport each of the plurality of thin materials from a storage location to the stacking operation table; and
- a processor electrically connected to the image sensing device and the transporting device, and further comprising:
  - a calculation module determining a specific location parameter of each of the plurality of thin materials on the stacking operation table based on the respective pair of images; and
  - a control module instructing the transporting device to place each of the plurality of thin materials on the stacking operation table in response to the specific location parameter of each of the plurality of thin materials.

17. The apparatus as claimed in claim 16, further comprising a measuring table disposed between the storage location and the stacking operation table, wherein the thin materials are insulating prepreg materials formed of a glass fiber nonwoven material and an epoxy resin, and the image sensing device includes a first and a second image sensing elements disposed on the measuring table.

18. The apparatus as claimed in claim 17, wherein the first and the second image sensing elements perform image collection for the each of the plurality of thin materials on the measuring table to obtain the respective pair of images simultaneously when each of the plurality of thin materials is placed on the measuring table by the transporting device, and the respective pair of images are transmitted to the processor.

19. The apparatus as claimed in claim 16, further comprising a measuring table disposed between the storage location and the stacking operation table, wherein the thin materials includes a substrate having a metal conductive layer.

20. The apparatus as claimed in claim 19, wherein the image sensing device performs image collection for the substrate on the measuring table to obtain the respective pair of images, and the first and the second image data are transmitted to the processor.

* * * * *